US010162037B2

(12) United States Patent
Zeller et al.

(10) Patent No.: US 10,162,037 B2
(45) Date of Patent: Dec. 25, 2018

(54) NAVIGATOR-BASED DATA CORRECTION FOR SIMULTANEOUS MULTISLICE MR IMAGING

(71) Applicant: Siemens Healthcare GmbH, Erlangen (DE)

(72) Inventors: Mario Zeller, Erlangen (DE); Himanshu Bhat, Cambridge, MA (US)

(73) Assignee: Siemens Healthcare GmbH, Erlangen (DE)

( * ) Notice: Subject to any disclaimer, the term of this patent is extended or adjusted under 35 U.S.C. 154(b) by 446 days.

(21) Appl. No.: 14/868,529

(22) Filed: Sep. 29, 2015

(65) Prior Publication Data

US 2017/0089999 A1   Mar. 30, 2017

(51) Int. Cl.
*G01R 33/565* (2006.01)
*G06T 5/00* (2006.01)
(Continued)

(52) U.S. Cl.
CPC ... *G01R 33/56563* (2013.01); *G01R 33/4835* (2013.01); *G01R 33/5611* (2013.01); *G01R 33/5616* (2013.01); *G01R 33/56554* (2013.01); *G06T 5/002* (2013.01); *G06T 7/0012* (2013.01); *G06T 2207/10088* (2013.01)

(58) Field of Classification Search
CPC .......... G01R 33/56563; G01R 33/5611; G01R 33/5616; G01R 33/4835; G01R 33/56554; G06T 7/0012; G06T 5/002; G06T 2207/10088
See application file for complete search history.

(56) References Cited

U.S. PATENT DOCUMENTS 5,581,184 A    12/1996 Heid
6,043,651 A *  3/2000 Heid ................ G01R 33/56554
                                                  324/218
(Continued)

OTHER PUBLICATIONS

K. Setsompop, et al., Blipped-Controlled Aliasing in Parallel Imaging for Simultaneous Multislice Echo Planar Imaging with Reduced g-Factor Penalty, Magnetic Resonance in Medicine 67:1210-1224 (2012).

(Continued)

*Primary Examiner* — Patrick Assouad
*Assistant Examiner* — Haidong Zhang

(57) ABSTRACT

A magnetic resonance method and system are provided for providing improved simultaneous multislice echo planar imaging (EPI) with navigator-based correction of image data for B0 drift and N/2 ghosting. The correction is based on two types of multi-echo phase-encoded navigator sequences having opposite readout gradient polarities, and optionally also uses a non-phase-encoded navigator sequence. One or more navigator sequences can be generated between each RF excitation pulse and the subsequent EPI readout sequence. A dynamic off-resonance in k-space technique can be used to correct for B0 drift, and a modified slice GRAPPA technique that is based on odd and even kernels can provide slice-specific correction for N/2 ghosting effects for the EPI MR image data sets. Various patterns of navigator sequences and/or interpolation of navigator data can be used to improve accuracy of the image data corrections.

16 Claims, 4 Drawing Sheets

(51) Int. Cl.
  *G01R 33/385*   (2006.01)
  *G06T 7/00*    (2017.01)
  *G01R 33/561*   (2006.01)
  *G01R 33/36*   (2006.01)
  *G01R 33/483*   (2006.01)

(56) References Cited

U.S. PATENT DOCUMENTS

2008/0048657 A1* 2/2008 Reeder .............. G01R 33/4828
                                                324/309
2011/0254548 A1* 10/2011 Setsompop ........ G01R 33/4835
                                                324/309
2012/0249138 A1  10/2012 Pfeuffer

OTHER PUBLICATIONS

K. Setsompop, et al., Improving diffusion MRI using simultaneous multi-slice echo planar imaging, NeuroImage 63 (2012) 569-580.
Pfeuffer, et al., Dynamic Phase Echo-Planar Imaging-Detection and Correction of Dynamic Off-Resonance, Proc. Intl. Soc. Mag. Reson. Med. 19 (2011).

* cited by examiner

NAVIGATOR-BASED DATA CORRECTION FOR SIMULTANEOUS MULTISLICE MR IMAGING

FIELD OF THE DISCLOSURE

The present disclosure relates to a method and a system for providing simultaneous multi-slice magnetic resonance images that include navigator-based correction of both B0 drift and N/2 ghosting effects.

BACKGROUND INFORMATION

Magnetic resonance (MR) imaging is a known technology that can produce images of the inside of an examination subject without radiation exposure. In a typical MR imaging procedure, the subject is positioned in a strong, static, homogeneous base magnetic field B0 (having a field strength that is typically between about 0.5 Tesla and 3 Tesla) in an MR apparatus, so that the subject's nuclear spins become oriented along the base magnetic field.

Radio-frequency (RF) excitation pulses are directed into the examination subject to excite nuclear magnetic resonances, and subsequent relaxation of the excited nuclear magnetic resonances can generate RF signals. Rapidly switched magnetic gradient fields can be superimposed on the base magnetic field, in various orientations, to provide spatial coding of the RF signal data (also referred to as image data). The RF signal data can be detected during a 'readout' phase, and mathematically processed to reconstruct images of the examination subject. For example, the acquired RF signal data are typically digitized and stored as complex numerical values in a k-space matrix. An associated MR image can be reconstructed from the k-space matrix populated with such values using a multi-dimensional Fourier transformation.

A magnetic resonance imaging technique known as echo planar imaging (EPI) is based on generation of RF signal data (or MR image data) in rapid sequence as a plurality of gradient echoes in the readout phase, with a rapid changing of the polarity of a readout gradient for successive echo signals. The alternating polarity of the readout gradients result in raw image data that fills lines in k-space in alternate directions (e.g., right-to-left, then left-to-right, then right-to-left, etc.). For example, an EPI sequence can include an RF excitation pulse and an image readout sequence that includes the gradient echoes accompanied by appropriate phase encoding and readout gradients.

EPI sequences used to image a plurality of slices can be prone to certain effects that can affect the resulting image data and lead to artifacts and/or degradation in the resulting image. For example, even slight deviations in phase that may occur when obtaining successive rows of data in k-space can lead to an artifact known as N/2 ghosting. An N/2 ghost can appear in the final image as "ghost" images, having a different intensity than the "true" image and shifted by N/2 in the positive and negative directions with reference to the middle of the N×N image matrix.

Another source of image degradation that can occur during EPI imaging sequences arises from slight changes in the local primary magnetic field B0 during imaging (also known as B0 drift). Such changes can result, for example, from heating or vibration in the imaging hardware during an imaging sequence. B0 drift can lead to such artifacts as loss of contrast, banding, or the like in different imaging sequences.

To correct for these undesirable effects, conventional non-simultaneous multislice EPI sequences often include acquisition of a set of navigator echoes prior to acquiring the imaging data for each slice. Such navigator echoes provide one-dimensional image information that can be used to identify and correct for, e.g., the aforementioned effects.

Navigator image data that can be used to improve image data quality for EPI imaging may include three non-phase-encoded echoes acquired with positive and negative readout gradient polarities. These navigator echoes with opposite readout gradient polarities can be referred to as odd and even echoes. An exemplary navigator sequence that includes a series of three echoes with alternating negative-positive-negative (even-odd-even) readout gradients is shown in the left half of FIG. 2A, preceding the conventional EPI readout sequence shown on the right half of FIG. 2A. This exemplary navigator sequence can be used to correct both N/2 ghosting and B0 drift effects during image reconstruction as follows.

For slice-specific N/2 ghost correction, the 0th and 1st order phase shifts between odd and even echoes can be determined in the readout direction by correlating their image space data. During image reconstruction, these factors are then used to retrospectively realign the odd and even k-space lines in order to compensate for shifts caused by factors such as gradient delays and eddy currents. This correction procedure is described, e.g., in U.S. Pat. No. 6,043,651 to Heid, which is incorporated herein by reference in its entirety.

B0 field drift effects can be corrected using a technique based on dynamic off-resonance in k-space (DORK) as described, e.g., in US Patent Publication No. US 2012/0249138A1 by Pfeuffer, which is incorporated herein by reference in its entirety. In the DORK method, the temporal B0 field drift is determined by comparing the phase evolution of navigator echoes having identical readout gradient polarities between consecutively acquired image volumes. Typically, this calculation is performed as an average over a complete image volume to improve accuracy.

In simultaneous multislice (SMS) EPI, several slices are excited and acquired simultaneously, leading to a k-space dataset which is based on signals originating from several slices collapsed on top of each other. Separating (or uncollapsing) of the slice data is performed during image reconstruction with the slice GRAPPA method that is described, e.g., in Setsompop et al., Blipped-Controlled Aliasing in Parallel Imaging for Simultaneous Multislice Echo Planar Imaging with Reduced g-Factor Penalty, *Magnetic Resonance in Medicine* 67:1210-1224 (2012), and in Setsompop et al., Improving diffusion MRI using simultaneous multi-slice echo planar imaging, *NeuroImage* 63 (2012), 569-580, both of which are incorporated herein by reference in their entireties.

The slice GRAPPA method is based on uncollapsing the data for each slice using a slice-specific GRAPPA kernel. These kernels are obtained from a separate non-collapsed reference scan that is obtained prior to the series of sequences used to obtain the collapsed image data. To reduce artifacts that may arise from misalignment of even and odd echoes in k-space, two kernels (odd and even) are calculated per slice.

For SMS acquisitions, the aforementioned navigator data obtained simultaneously from multiple slices is also collapsed in the same way as the image data. Because the DORK method performs an average calculation over the complete image volume, the collapsed navigator datasets can be used directly in that technique to correct for B0 field drift effects. However, such collapsed multislice navigator cannot be utilized for slice-specific N/2 ghost correction, because there is no known way to uncollapse the non-phase-encoded navigator data, e.g., to generate slice-specific navigator data.

In certain SMS EPI imaging procedures, the non-collapsed navigator data (navigator lines) from the reference scan can be utilized for all imaging volumes in a subsequent series of data acquisitions. However, this approach can lead to increased ghosting artifacts if the conditions under which the reference navigator data were acquired are changed, e.g., by subject motion or eddy current variations during the imaging procedure.

Accordingly, it would be desirable to have a system and method for magnetic resonance imaging that addresses some of the shortcomings described above, and that may further provide navigator data that can be used to correct for both B0 drift and N/2 ghosting during simultaneous multislice EPI imaging procedures.

SUMMARY OF EXEMPLARY EMBODIMENTS

Exemplary embodiments of the present disclosure can provide a system and method that enables correction of both B0 drift and N/2 ghosting effects during simultaneous multislice (SMS) echo planar imaging (EPI) procedures using phase-encoded navigators having different polarities, and optionally also using conventional non-phase-encoded navigators. Embodiments of the disclosure can further provide slice-specific N/2 ghosting correction for SMS imaging procedures.

In one embodiment, a magnetic resonance imaging system and method are provided to obtain EPI image data for a volume to be imaged, including simultaneously obtaining such data from a plurality of slices (also known as simultaneous multislice, or SMS, imaging). Such multislice imaging data can be obtained, e.g., using conventional techniques. For example, a MR system can be configured to process the corrected image data to generate images of the volume of interest, which may be an anatomical volume. In order to provide improved correction of errors relating to B0 field drift and N/2 ghosting, one or more navigator echo sequences can be obtained following an RF multislice excitation and prior to an EPI readout sequence associated with the RF excitation. Such navigator sequences can be used to correct the image data acquired during the readout sequence, e.g., to reduce or eliminate B0 drift and N/2 ghosting errors.

The MRI system and method can also include correction for B0 field drift effects during an image scanning procedure using a technique based on dynamic off-resonance in k-space, where the temporal B0 field drift can be determined by comparing the phase evolution of navigator echoes having identical readout gradient polarities between consecutively acquired image volumes. This calculation may be performed as an average over a complete image volume to improve accuracy. The navigator echoes used for the B0 correction can be provided as described below.

The MRI system and method can further include correction for N/2 ghosting by determining the 0th and 1st order phase shifts between odd and even navigator echoes in the readout direction by correlating their image space data. During image reconstruction, these factors can then used to retrospectively realign the odd and even k-space lines in order to compensate for shifts caused by factors such as gradient delays and eddy currents.

In embodiments of the disclosure, each navigator sequence includes three or more echoes. A non-phase-encoded navigator sequence (NavA) can be provided in some embodiments that includes a conventional readout of three non-phase-encoded echoes using readout pulses of alternating polarity.

Certain ones of the navigator sequences obtained during an imaging scan can be phase encoded, e.g., by providing a phase encoding blip before each navigator echo readout. A first type of phase-encoded navigator sequence (NavB) can be provided in which the first blip is downward, providing a negative phase encoding of $-\Delta k_y$ for the first navigator echo. The second blip is upward, which cancels out the previous phase blip such that the second navigator echo has no phase encoding. The third blip is also upward, which results in a positive phase encoding of $+\Delta k_y$ for the third navigator echo. An additional balancing blip can optionally be provided after the navigator echoes, to eliminate the phase shift associated with the preceding $3^{rd}$ navigator echo. The polarity of the readout gradient can alternate for successive echoes in the navigator sequence.

A second type of phase-encoded navigator echo sequence (NavC) that can be used with embodiments of the present disclosure is similar to the NavB phase-encoded navigator sequence, in that that the three navigator echoes are provided with the same phase encodings. An additional readout gradient can be provided after the NavC navigator echoes to ensure that the succeeding echo train for the imaging readout portion of the sequence has a polarity identical to those of the NavB phase-encoded navigator sequence and/or of the NavA non-phase-encoded navigator sequence. The readout gradients for the NavC sequence have polarities that are reversed as compared to those in NavB phase-encoded navigator sequence. Thus, the traversal of each navigator echo in the $k_x$ direction of k-space is "mirrored" (e.g. in an opposite x-direction) between the NavB and NavC phase-encoded navigator echoes.

In further embodiments, the phase encoding blips can be opposite in sign, e.g., such that the first, second, and third navigator echoes have phase encodings of $+\Delta k_y$, 0, and $-\Delta k_y$, respectively. The balancing blips and/or extra readout gradient following the navigator sequence can be provided in a form and polarity consistent with these reversed phase-encoding polarities to eliminate the phase shift following the navigator echoes and/or to ensure the polarity is the same following all navigator sequences and prior to the corresponding readout sequences.

The NavA (non-phase-encoded), NavB, and NavC navigator sequences can be used to provide both N/2 ghost and B0 field drift correction. In some embodiments of the disclosure, at least one navigator sequence such as NavA, NavB, or NavC precedes each of a plurality of EPI imaging readout sequences during an overall imaging scan. In further embodiments, two or more such navigator sequences can be acquired prior to some or all of a plurality of EPI imaging readout sequences during an overall imaging scan.

In accordance with certain embodiments of the disclosure, the non-phase-encoded NavA navigator sequence can be used to correct the multislice EPI image data for B0 drift using conventional correction techniques. Additionally, the NavB and NavC navigator scans can be multiplied with the odd and even kernels, respectively, in a modified slice GRAPPA technique, to obtain uncollapsed slice data for the central non-phase-encoded line of the navigator echoes. The central lines of the NavB and NavC navigator sequences have opposite polarity, and thus can be used to calculate N/2 ghost correction factors for each uncollapsed slice.

The three navigator types can be generated in any of several patterns to provide varying temporal resolutions for the different types of data correction described herein. In one embodiment, the navigators can be distributed equally, e.g., in a pattern such as NavA, NavB, NavC, NavA, NavB, NavC, etc., where each navigator is obtained following an RF excitation pulse and prior to the associated EPI readout sequence. In this exemplary pattern, both the NavA navigator (for correct for B0 drift correction) and the NavB+NavC navigator pair (used together for N/2 ghosting correction) can be updated once every three imaging readout sequences.

In a further embodiment, a pattern such as NavA, NavB, NavA, NavC, NavA, NavB, NavA, NavC, etc. can be provided. Accordingly, the NavA navigator for B0 drift correction can be updated once every second imaging readout sequence, whereas the NavB+NavC pair of navigators for N/2 ghosting correction are updated once every four imaging readout sequences. This embodiment provides a relatively higher temporal resolution for B0 drift correction, and a correspondingly lower temporal resolution for N/2 ghosting correction.

In some embodiments, the most recent preceding navigator-based correction data (e.g. most recent NavA data for B0 drift correction, or most recent pair of NavB+NavC data for N/2 ghosting correction) can be used to correct image data corresponding to a particular subsequent RF excitation until newer navigator data is available for each type of correction.

In further embodiments, navigator data can be interpolated between successively-generated navigator sequences of the same type (e.g. NavA, NavB, or NavC) to correct EPI image data obtained between these navigators. Such interpolation can be performed, e.g., using a linear temporal weighting between the most recent and very next sets of data for the particular type of navigator, weighted by the respective temporal intervals between each navigator acquisition and the imaging readout sequence being corrected.

In still further embodiments, other patterns of the NavA, NavB and NavC navigators can be provided prior to successive EPI imaging readout sequences. For example, two 3-echo navigator sequences can be obtained before each EPI readout sequence to increase temporal resolution of the image correction. In one embodiment, a "two-navigator" pattern such as: NavA, NavB, readout; NavA, NavC, readout; NavA, NavB, readout . . . can be provided in some embodiments. In an alternate embodiment, a two-navigator pattern can be provided, such as: NavA, NavB, readout; NavC, NavA, readout; NavB, NavC, readout . . . . In this exemplary navigator pattern, each type of navigator is obtained twice for every three EPI excitation/readout imaging sequences. Other such sequences can be obtained in further embodiments, with the number and type of each navigator obtained following an RF excitation chosen to provide a desired temporal resolution for the associated correction that uses the navigator data.

In yet further embodiments, a non-constant number of navigators can be obtained following each RF excitation. For example, in one embodiment, a navigator pattern such as: NavA, readout; NavB+NavC, readout; NavA, readout; NavB+NavC, readout . . . can be provided. Other patterns for navigator acquisition can be provided in which the number of navigators acquired before each readout sequence also may vary.

In another embodiment, phase-encoded navigators (e.g. NavB, NavC) can be used to correct for both B0 drift and for N/2 ghosting. The central k-space line of the most recent N/2 ghosting navigator can be used together with the central k-space line of the imaging scan (or readout sequence) for each uncollapsed slice to perform the B0 field correction after application of the slice GRAPPA method to uncollapse the multislice image data resulting from a particular RF excitation. For example, an alternating pattern of phase-encoded navigators of NavB, NavC, NavB, NavC, NavB, NavC, etc. can be used to obtain full temporal resolution for B0 field drift correction and halved temporal resolution for N/2 ghost correction, where the NavB and NavC data are fully updated every two imaging scans for N/2 ghosting correction. In one embodiment, each of the NavB and NavC data values can be interpolated for every second readout sequence to improve the accuracy of each type of navigator data for image readout sequences obtained for RF excitations where the particular type of navigator was not obtained.

In still further embodiments, navigator sequences having more than three reference lines can be acquired for slice GRAPPA kernels having a size larger than 3 in the phase-encoding direction. In one embodiment, five lines can be acquired for the navigators when using a slice GRAPPA kernel size of 5 in the phase encoding direction, where the five lines can have phase offsets of $-2\Delta k_y$, $-1\Delta k_y$, 0, $+1\Delta k_y$, $+2\Delta k_y$ with alternating readout gradient polarities. In other embodiments, navigator sequences having a different number of reference lines, with alternating readout gradient polarities, can be provided to accommodate slice GRAPPA kernels having various sizes.

When employing the navigator data to provide B0 drift correction, two lines having the same polarity obtained from two sequential navigators can be used to calculate the B0 drift between consecutively-acquired image volumes. In a further embodiment, if more than three non-phase-encoded navigator lines are acquired, then a plurality of pairs of lines with identical polarity from these navigators can be averaged to increase accuracy of the drift correction. For example, if five non-phase-encoded lines are acquired, with lines (1, 3, 5) being odd echoes, and lines (2, 4) being even echoes, then one or more of the pairs (1, 3), (2, 4), (3, 5) and (1, 5) can be used to estimate the B0 drift. Two or more of these pairs of lines can also be used in certain embodiments, where the resulting corrections can then be averaged in a final step to get a more accurate estimation.

In further embodiments of the disclosure, methods for obtaining simultaneous multislice EPI images are provided that include correcting for both N/2 ghosting and B0 drift using navigator sequences. The navigator sequences can include two types of phase-encoded navigators having opposite polarities, and optionally non-phase-encoded navigators. The methods can include the various types of navigator sequences, navigator acquisition patterns, and data correction techniques and procedures described herein in detail. The disclosed methods can provide good spatial resolution for both types of image data corrections, to better account for factors that may impair data quality during an imaging procedure.

BRIEF DESCRIPTION OF THE DRAWINGS

Further objects, features and advantages of the present disclosure will become apparent from the following detailed description taken in conjunction with the accompanying figures showing illustrative embodiments, results and/or features of the exemplary embodiments of the present disclosure, in which.

Figure 1:
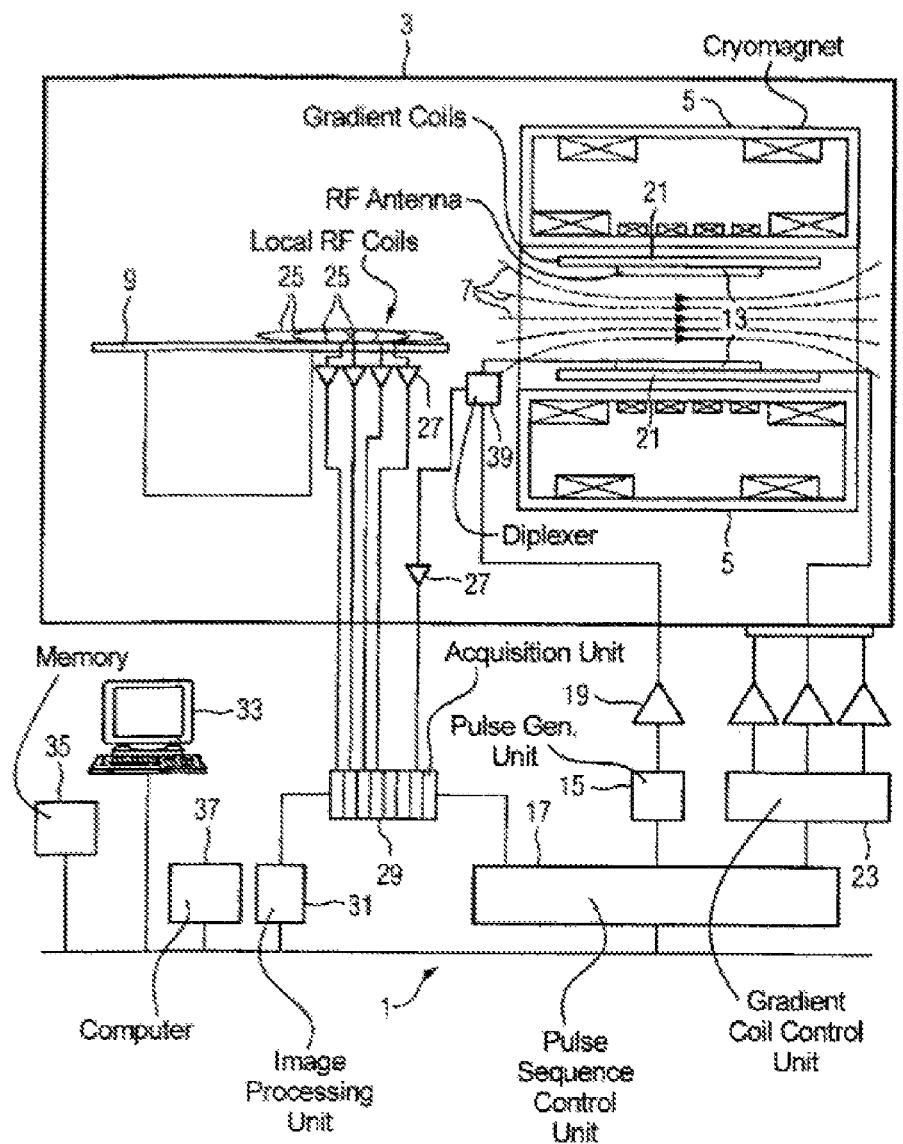
FIG. 1 schematically illustrates the basic components of a magnetic resonance imaging system constructed and operating in accordance with embodiments of the present disclosure.

Throughout the drawings, the same reference numerals and characters, unless otherwise stated, are used to denote like features, elements, components, or portions of the illustrated embodiments. Similar features may thus be described by the same reference numerals, which indicate to the skilled reader that exchanges of features between different embodiments can be done unless otherwise explicitly stated. Moreover, while the present disclosure will now be described in detail with reference to the figures, it is done so in connection with the illustrative embodiments and is not limited by the particular embodiments illustrated in the figures. It is intended that changes and modifications can be made to the described embodiments without departing from the true scope and spirit of the present disclosure as defined by the appended claims.

DETAILED DESCRIPTION OF EXEMPLARY EMBODIMENTS

The present disclosure relates to methods and systems for providing correction of magnetic resonance (MR) imaging data using navigators. The navigators can be used, e.g., to correct for both N/2 ghosting and B0 drift effects that may occur during simultaneous multi-slice (SMS) echo planar imaging (EPI) procedures.

FIG. 1 schematically shows the design of a magnetic resonance system 1 with certain components in accordance with embodiments of the present disclosure. The MR system 1 is configured, inter alia, to provide various magnetic fields tuned to one another as precisely as possible in terms of their temporal and spatial characteristics to facilitate examination of portions of a subject's body using magnetic resonance imaging techniques.

A strong magnet 5 (typically a cryomagnet) having a tunnel-shaped opening is provided in a radio-frequency (RF) shielded measurement chamber 3 to generate a static, strong base (or polarizing) magnetic field 7. The strength of the base magnetic field 7 is typically between 1 Tesla and 3 Tesla, although lower or higher field strengths can be provided in certain embodiments. A body or a body part to be examined (not shown) can be positioned within the substantially homogeneous region of the base magnetic field 7, e.g., provided on a patient bed 9.

Excitation of nuclear spins of certain atoms within the body can be provided via magnetic RF excitation pulses that are radiated using an RF antenna 13, such as a body coil. Other configurations of RF coils or antennas can also be provided in further embodiments, and such configurations may be adapted for particular portions of the subject anatomy to be imaged. The RF excitation pulses are generated by a pulse generation unit 15 that is controlled by a pulse sequence control unit 17. After an amplification by a radio-frequency amplifier 19, the RF pulses are relayed to the RF antenna 13. The exemplary RF system shown in FIG. 1 is a schematic illustration, and particular configurations of the various components may vary from that illustrated in exemplary embodiments of the disclosure. For example, the MR system 1 can include a plurality of pulse generation units 15, a plurality of RF amplifiers 19, and/or a plurality of RF antennas 13 that may have different configurations depending on the body parts being imaged.

The magnetic resonance system 1 further includes gradient coils 21 that can provide directionally and temporally varied magnetic gradient fields for selective excitation and spatial encoding of the RF signals that are emitted and/or received by the RF antenna(s) 13. The gradient coils 21 are typically oriented along the three primary axes (x- y- and z-directions), although other or additional orientations may be used in certain embodiments. Pulsed current supplied to the gradient coils 21 can be controlled by a gradient coil control unit 23 that, like the pulse generation unit 15, is connected with the pulse sequence control unit 27. By controlling the pulsed current supplied to the gradient coils 21, transient gradient magnetic fields in the x-, y-, and z-directions can be superimposed on the static base magnetic field B0. This makes it possible to set and vary, for example, the directions and magnitudes of a slice gradient magnetic field Gs, a phase encode gradient magnetic field Ge, and a read (frequency encode) gradient magnetic field Gr, which can be synchronized with emission and detection of RE pulses. Such interactions between RF pulses and transient magnetic fields can provide spatially selective excitation and spatial encoding of RF signals.

RF signals emitted by the excited nuclear spins can be detected by the RF antenna 13 and/or by local coils 25, amplified by associated radio-frequency preamplifiers 27, and processed further and digitized by an acquisition unit 29. In certain embodiments where a coil 13 (such as, for example, a body coil) can be operated both in transmission mode and in acquisition mode (e.g., it can be used to both emit RF excitation pulses and receive RF signals emitted by nuclear spins), the correct relaying of RF energy is regulated by an upstream transmission-reception diplexer 39.

An image processing unit 31 can generate one or more images based on the RF signals that represent image data. Such images can be presented to a user via an operator console 33 and/or be stored in a memory unit 35. A processor arrangement 37 can be provided in communication with the memory unit 35, and configured to execute computer-executable instructions stored in the memory unit 35 to control various individual system components. For example, the processor arrangement 37 can be configured by programmed instructions to control components such as, e.g., the gradient coil control unit 23, the pulse generation unit 15, and/or the pulse sequence control unit 27 to generate particular sequences of RF pulses and magnetic field variations, process and/or manipulate image data, etc., according to exemplary embodiments of the disclosure described herein.

Embodiments of the present disclosure can provide an MR imaging system 1 as that shown in FIG. 1 that is configured to provide SMS EPI imaging sequences that include modified navigator scans to facilitate dynamic updating of both N/2 ghost correction and B0 field drift correction, as described herein. The MR system 1 can be further configured to process the corrected image data to generate images of the volume of interest, which may be an anatomical volume.

Figure 2A:
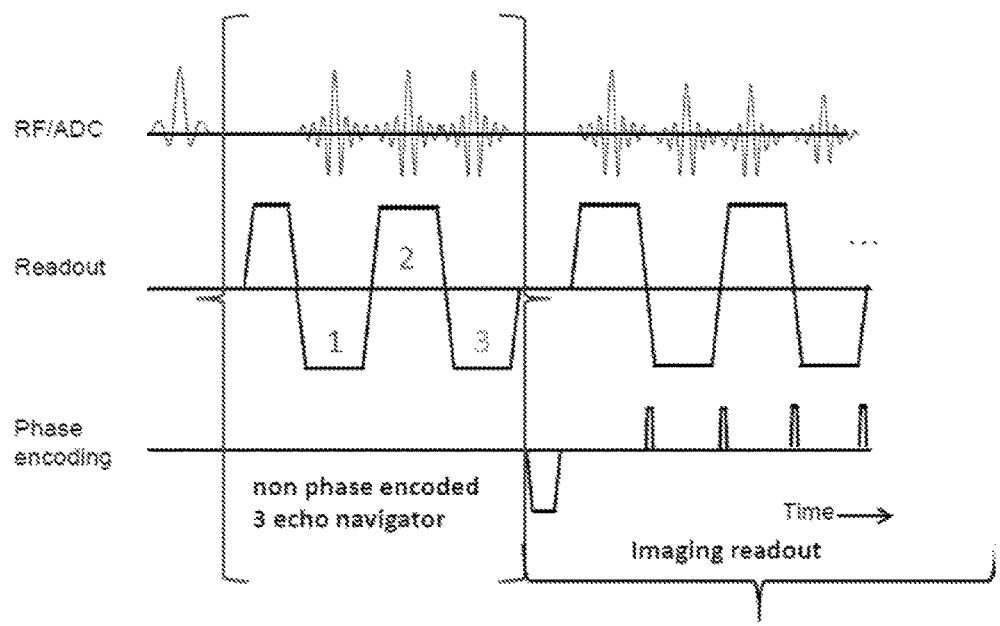
FIGS. 2A-2C show exemplary sequences of a non-phase-encoded 3-echo navigator sequence, a phase-encoded 3-echo navigator sequence having a first polarity, and a phase-encoded 3-echo navigator sequence having a second polarity that is opposite to the first polarity, respectively, where each navigator sequence is followed by an EPI imaging readout sequence.

A conventional EPI sequence diagram that includes a non-phase-encoded navigator scan is shown in FIG. 2A. An initial RF excitation pulse (shown at the far left of the top RF/ADC line) is used to excite a portion of the volume to be imaged. For example, this RF pulse can be configured to excite one or more slices. Three non-phase-encoded echoes (shown in the left half of the RF/ADC line in FIG. 2A) are then acquired using readout pulses of alternating polarity (labeled 1, 2 and 3 on the Readout line in FIG. 2A).

Figure 3A:
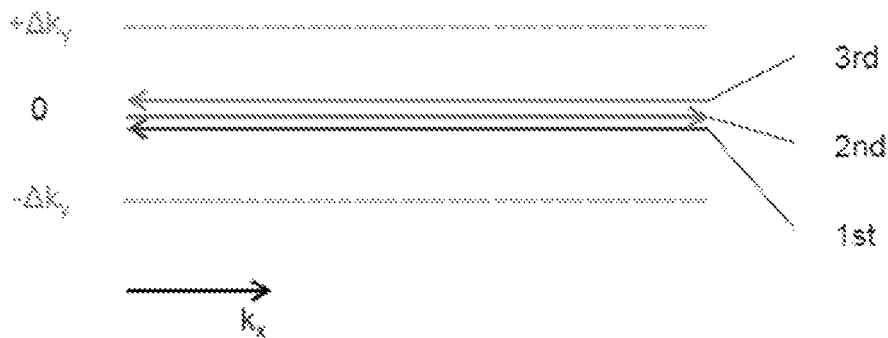
FIGS. 3A-3C show exemplary trajectories in k-space corresponding to the navigator sequences shown in FIGS. 2A-2C, respectively.

The trajectories of the image data from these non-phase-encoded navigator echoes as they fill a portion of k-space is shown in FIG. 3A. The first and third echoes have a negative readout gradient polarity and traverse k-space from right to left, whereas the second navigator echo has a positive readout gradient polarity and traverses k-space from left to right, as illustrated schematically in FIG. 3A. These non-phase-encoded navigator echoes sample the same center k-space line in opposite directions (shown with a negligible phase spacing in the $k_y$ (vertical) direction of k-space in FIG. 3A for illustrative purposes).

These non-phase-encoded navigator echoes can be used later in a conventional imaging procedure to provide certain types of image data correction. After the navigator echoes are detected, a pre-phaser gradient is applied in the phase-encoding direction (shown as the downward lobe near the center of the Phase encoding line in FIG. 2A), which encodes the subsequent echo with the highest frequency in $k_y$ direction. The k-space is then sampled utilizing an EPI trajectory, with successive horizontal trajectories alternating in leftward and rightward directions. The phase blips (shown as narrow upward lobes on the Phase encoding line in FIG. 2A) provide phase offsets that shift the horizontal line associated with each successive readout echo upward (in the $k_y$ direction), thus generating an EPI trajectory that fills in the k-space data.

Figure 2B:
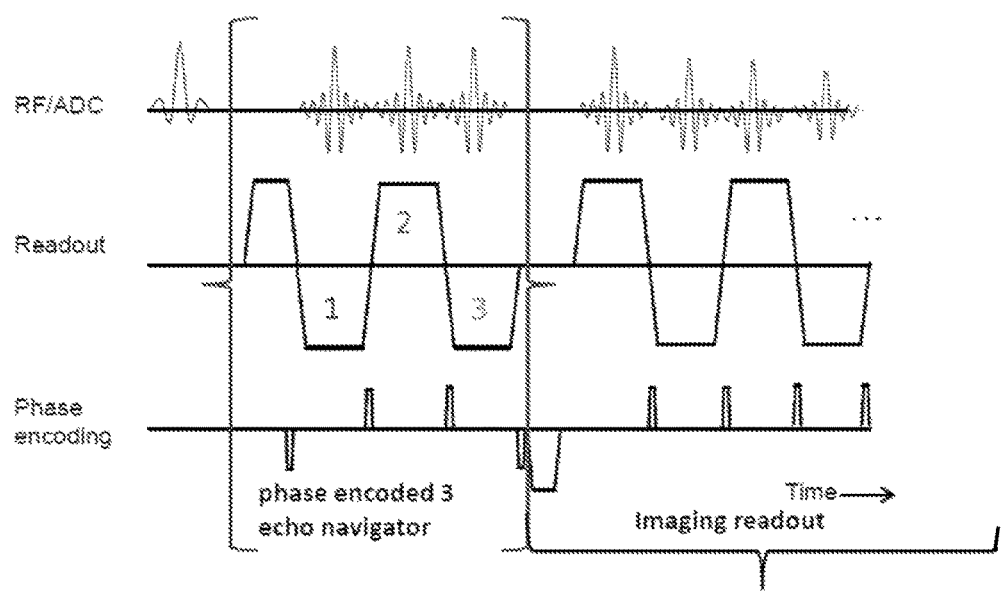

FIG. 2B shows a modified navigator echo sequence (or 'navigator sequence') in accordance with embodiments of the present disclosure. In this exemplary sequence, the phase encoding is varied for the 3 navigator echoes. Phase encoding blips (shown as the narrow lobes on the left half of the Phase encoding line in FIG. 2B) are provided before each navigator echo readout. The first blip is downward, providing a negative phase encoding of $-\Delta k_y$ for the first navigator echo. The second blip is upward, which cancels out the previous phase blip such that the second navigator echo has no phase encoding. The third blip is also upward, which results in a positive phase encoding of $+\Delta k_y$ for the third navigator echo. An additional balancing blip provided after the navigator echoes, shown in FIG. 2B as a narrow downward lobe at the center of the Phase encoding line, can be configured to revert the magnetization following the navigator echoes, e.g., to eliminate the phase shift associated with the preceding $3^{rd}$ navigator echo. This balancing blip can optionally be combined with the subsequent pre-phaser gradient, e.g., for increased efficiency.

Figure 3B:
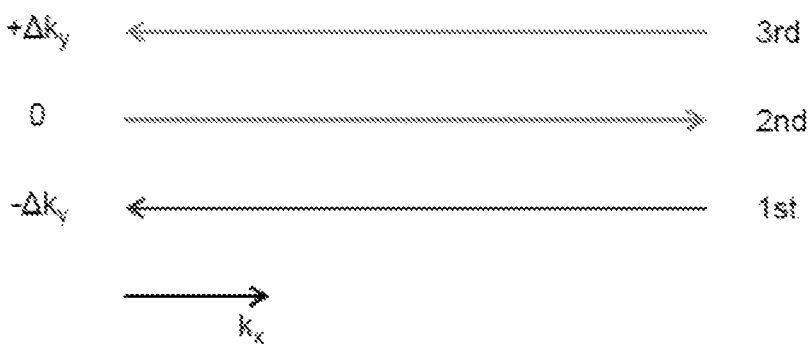

The trajectory of these 3 phase-encoded navigator echoes of FIG. 2B in k-space are illustrated in FIG. 3B. In contrast to the conventional non-phase-encoded navigator echo trajectories shown in FIG. 3A, adjacent phase-encoded navigator k-space trajectories are separated by a phase difference having a magnitude of $\Delta k_y$, as illustrated in FIG. 3B.

Figure 2C:
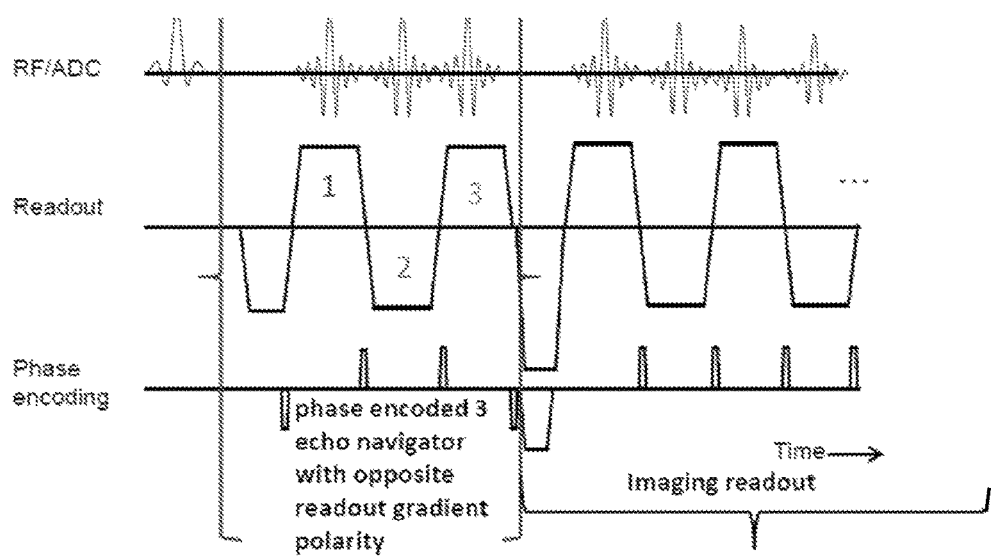
Figure 3C:
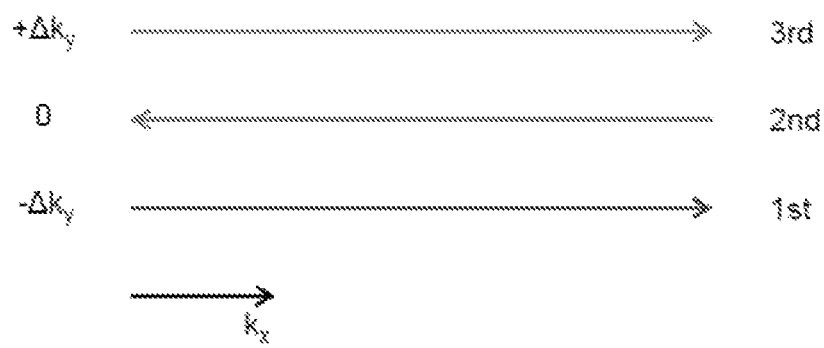

FIG. 2C illustrates a further modified navigator echo sequence that can be used with embodiments of the present disclosure. This exemplary sequence is similar to the modified phase-encoded navigator sequence shown in FIG. 2B, in that the 3 navigator echoes are provided with negative phase encodings of $-\Delta k_y$, zero, and $+\Delta k_y$, respectively. The corresponding k-space traversals for these 3 navigator echoes of FIG. 2C are also separated by a $\Delta k_y$ phase difference, as shown in FIG. 3C. However, the readout gradients for the navigator echoes in FIG. 2C (labeled as 1, 2 and 3) have reversed polarities as compared to those in the navigator sequence shown in FIG. 2B. Thus, the traversal of each navigator echo in the $k_x$ direction in FIG. 3C is in a direction opposite to that of the corresponding navigator echo in FIG. 3B. This "mirroring" of the k-space traversals in the $k_x$ direction results from the opposite readout gradient polarities provided for the two sets of navigator echoes. An additional readout gradient after the navigator echoes (shown as a deep downward lobe following the third readout gradient in FIG. 2C) ensures that the succeeding echo train for the imaging readout portion of the sequence has a polarity identical to those for the sequences shown in FIGS. 2A and 2B.

In further embodiments, the phase encoding blips can be opposite in sign, e.g., such that the first, second, and third navigator echoes have phase encodings of $+\Delta k_y$, 0, and $-\Delta k_y$, respectively. The balancing blips and/or extra readout gradient following the navigator sequence can be altered consistent with these reversed phase-encoding polarities to eliminate the phase shift following the navigator echoes and/or to ensure the polarity is the same following all navigator sequences and prior to the corresponding readout sequences.

The EPI sequences with navigators shown in FIGS. 2A-2C are merely exemplary, and embodiments of the present disclosure are not limited to these particular sequences. For example, further embodiments of the disclosure can include navigator-based image correction for diffusion-weighted spin-echo EPI procedures. In these embodiments, a conventional diffusion preparation module can be generated as part of the EPI sequences, where such diffusion preparation module may include one or more refocusing pulses and diffusion encoding gradients. Navigator data (e.g. one or more multi-echo navigator sequences) as described herein can be acquired together with the diffusion-weighted spin-echo EPI sequences. For example, the navigator data (e.g. one or more multi-echo navigator sequences) can be acquired after the RF excitation pulse and before the diffusion preparation module. The diffusion preparation module can then be followed by a readout module. In another embodiment, the navigator data can be obtained during the diffusion preparation module sequence. In a still further embodiment, the navigator data can be obtained after the data readout sequence. The navigator sequences included in this embodiment can be a plurality of phase-encoded navigator sequences having opposite polarities as described herein and shown, e.g., in FIGS. 2B and 2C, and optionally further navigators that are not phase-encoded navigator sequence as shown, e.g., in FIG. 2A.

In yet further embodiments, the navigator data for the various types of navigators described herein can be obtained after the data readout sequence for any of the EPI sequences.

In accordance with embodiments of the disclosure, the unmodified (i.e. non-phase-encoded) navigator sequence shown in FIG. 2A can be used to correct for B0 drift using conventional correction techniques as described herein above. Because the two phase-encoded navigator scans shown in FIGS. 2B and 2C are mirrored in polarity, they can be multiplied with the odd and even kernels, respectively, in a modified slice GRAPPA method, to obtain uncollapsed slice data for the central non-phase-encoded line of the navigator echoes.

Further, the central lines of the two navigator sequences shown in FIGS. 2B and 2C have opposite polarity, and thus can be used to calculate N/2 ghost correction factors for each uncollapsed slice. For example, to detection a phase difference between odd and even echoes of these central navigator echo lines for N/2 ghost correction, a Fourier transform can be taken of both echoes. A linear phase ramp can then be determined for each echo using, e.g., an autocorrelation function. A linear phase can then be removed from these echoes, and a cross-correlation between them can be performed to determine the constant phase difference. The linear and constant phase differences estimated by this procedure using the navigator data can then be used to correct the odd and even k-space lines in the EPI imaging data. Exemplary details of this type of correction are provided, e.g., in U.S. Pat. No. 5,881,184 to Heid, where the navigator echoes N⁺ and N⁻ shown in FIG. 12 therein have opposite polarities (as indicated by the opposite readout gradients in FIG. 10 therein).

The 3-echo navigator sequences shown in FIGS. 2A, 2B and 2C can be referred to as NavA (non-phase-encoded), NavB (polarity 1), and NavC (polarity 2—opposite of polarity 1), respectively. To dynamically obtain data for both N/2 ghost and B0 field drift correction, the three navigator variants illustrated in FIGS. 2A-2C can be generated in any of several patterns. Different orders for obtaining the various navigator sequences (where a navigator sequence such as NavA, NavB, or NavC precedes each of a plurality of EPI imaging readout sequences) can provide varying temporal resolutions for the different types of data correction described herein.

In one embodiment, the navigators can be distributed equally, e.g., in a pattern such as NavA, NavB, NavC, NavA, NavB, NavC, etc. An EPI imaging readout sequence follows each navigator sequence. In this exemplary pattern, both the NavA navigator (for correct for B0 drift correction) and the NavB+NavC navigator pair (used together for N/2 ghosting correction) can be updated once every three imaging readout sequences. This provides a uniform temporal resolution for both types of data correction.

In a further embodiment, a pattern such as NavA, NavB, NavA, NavC, NavA, NavB, NavA, NavC, etc. can be provided. In this embodiment, the NavA navigator for B0 drift correction can be updated once every second imaging readout sequence, whereas the NavB+NavC pair of navigators for N/2 ghosting correction are updated once every four imaging readout sequences. This embodiment provides a relatively higher temporal resolution for B0 drift correction, and a correspondingly lower temporal resolution for N/2 ghosting correction.

Embodiments of the disclosure can reduce the temporal resolution for a particular navigator-based correction. For example, the NavA-NavB-NavC-NavA-NavB-NavC- . . . navigator sequence updates the B0 drift correction only once every third RF excitation of a volume (e.g., once every third imaging readout sequence). However, such modified navigator patterns provide an improvement over current MR imaging techniques where only the very first reference scan in an entire imaging procedure (comprising multiple RF excitations and EPI readout sequences) is used for N/2 ghost correction.

In some embodiments, the most recent preceding navigator-based correction data (e.g. most recent NavA data for B0 drift correction, or most recent pair of NavB+NavC data for N/2 ghosting correction) can be used to correct image data corresponding to a particular RF excitation until newer navigator data is available for each type of correction. The number of excitations (each corresponding to an image readout sequence and an imaged volume) that use the same navigator data before it is updated can depend on the particular pattern of modified navigator echo sequences used.

In further embodiments, one or both types of corrections can be applied to the data for a particular image readout sequence by interpolating between the most recent navigator and the next corresponding navigator. Such interpolation can be performed, e.g., using a linear temporal weighting. For example, if a NavA navigator is obtained immediately preceding every second image readout sequence, then the intermediate image data can be corrected for B0 drift by a simple average of the preceding and subsequent NavA data. Similar averaging can be performed for the NavB and NavC data, each one interpolated individually between the most recent and very next sets of data for the particular type of navigator, weighted by the respective temporal intervals between each navigator acquisition and the imaging readout sequence being corrected.

In still further embodiments, different sequences of the NavA, NavB and NavC navigators can be provided prior to successive EPI imaging readout sequences. For example, two 3-echo navigator sequences can be obtained before each EPI readout sequence to increase temporal resolution. An exemplary "two-navigator" sequence such as: NavA, NavB, readout; NavA, NavC, readout; NavA, NavB, readout . . . can be provided in some embodiments.

In an alternate embodiment, a two-navigator pattern can be provided, such as: NavA, NavB, readout; NavC, NavA, readout; NavB, NavC, readout . . . . In this exemplary navigator pattern, each type of navigator is obtained twice for every three EPI excitation/readout imaging sequences. Accordingly, navigator data for each type of navigator can be interpolated for every 3rd readout imaging sequence, using actual navigator data acquired for the immediately preceding and immediately subsequent imaging sequences. Such "two-navigator" patterns increase the temporal resolution of both the B0 drift and the N/2 ghosting as compared with the single-navigator patterns shown in FIGS. 2A-2C, at the cost of slightly increased TE and corresponding slightly decreased temporal resolution for the overall imaging scan.

In still another embodiment, an "asymmetric" navigator pattern (having a non-uniform number of navigator sequences provided before each readout sequence) can be provided. For example, a sequence such as, e.g., NavA, readout; NavB+NavC, readout; NavA, readout; NavB+NavC, readout . . . can be provided. This exemplary pattern alternately provides either one or two navigator sequences before each readout sequence, thereby improving temporal resolution of error corrections relative to a single-navigator pattern, and improving temporal resolution of the overall imaging scan (by slightly reducing the average TE) relative to a two-navigator pattern as described above.

In another embodiment, an alternating navigator pattern of NavB, NavC, NavB, NavC, NavB, NavC, etc. can be used to obtain full temporal resolution for B0 field drift correction and halved temporal resolution for N/2 ghost correction. For example, after application of the slice GRAPPA method to uncollapse the slice image data resulting from a particular SMS RF excitation, the central k-space line of the most recent navigator can be used together with the central k-space line of the imaging scan (or readout sequence) for each uncollapsed slice to perform the B0 field correction (as described, e.g., in previously-cited US Patent Publication No. US 2012/0249138 by Pfeuffer). The NavB and NavC data are fully updated every two imaging scans, such that the N/2 ghosting correction can be performed with half the temporal resolution of the imaging sequences. Each of the NavB and NavC data values can be interpolated for every second readout sequence, as described above, to improve the accuracy of the navigators for image readout sequences where the other type of navigator was acquired immediately prior. Because this embodiment provides navigator data for each slice, it can even be utilized to correct for effects of non-uniform motion of the imaged volume, such as may occur during respiration, on the image phase.

If a slice GRAPPA kernel with a size larger than 3 in the phase-encoding direction is used, more than 3 reference lines can be acquired for each navigator sequence, and this data can then be multiplied with the kernel to obtain uncollapsed data for the two N/2 ghost correction datasets. For example, if a slice GRAPPA kernel size of 5 is used, then 5 lines can be acquired for the navigator (e.g., with phase offsets of $-2\Delta k_y$, $-1\Delta k_y$, 0, $+1\Delta k_y$, $+2\Delta k_y$) with alternating readout gradient polarities similar to the 3 line case. This procedure can be generalized in further embodiments to accommodate slice GRAPPA kernels having various sizes.

When employing the DORK method with navigator data to provide B0 drift correction, two lines having the same polarity obtained from two sequential navigators can be used to calculate the B0 drift between consecutively-acquired image volumes. In a further embodiment, if no more than three non-phase-encoded navigator lines are acquired, then a plurality of pairs of lines with identical polarity from these navigators can be averaged to increase accuracy of the drift correction. For example, if five non-phase-encoded lines are acquired, with lines (1, 3, 5) being odd echoes, and lines (2, 4) being even echoes, then one or more of the pairs (1, 3), (2, 4), (3, 5) and (1, 5) can be used to estimate the B0 drift. Two or more of these pairs of lines can also be used in certain embodiments, where the resulting corrections can then be averaged in a final step to get a more accurate estimation.

Accordingly, as described herein, embodiments of the present disclosure can provide a system and method that enables correction of both B0 drift and N/2 ghosting effects during simultaneous multi-slice (SMS) echo planar imaging (EPI) procedures using phase-encoded navigators having different polarities, and optionally also using conventional non-phase-encoded navigators. The non-phase-encoded navigators (or alternatively, an average of the phase-encoded navigators) obtained for successive EPI imaging sequences can be used to correct image data for B0 drift.

Further, phase-encoded navigators having opposite polarities can be used for slice-specific N/2 ghosting correction. One or more of such navigators can be obtained after each RF excitation of the imaged volumes, e.g., prior to the EPI imaging readout sequence. The B0 drift and N/2 ghosting corrections can be achieved with overall improved temporal resolution as compared to conventional techniques where, for example, a single set of navigator data is used to correct for N/2 ghosting over an entire imaging procedure and uncollapsing navigator data for slice-specific N/2 ghost correction is not possible.

The foregoing merely illustrates the principles of the present disclosure. Various modifications and alterations to the described embodiments will be apparent to those skilled in the art in view of the teachings herein. It will thus be appreciated that those skilled in the art will be able to devise numerous techniques which, although not explicitly described herein, embody the principles of the present disclosure and are thus within the spirit and scope of the present disclosure. All patents and publications cited herein are incorporated herein by reference in their entireties.

What is claimed is:

1. A method for correcting multislice echo planar imaging (EPI) data for B0 drift effects and N/2 ghosting effects in a magnetic resonance (MR) system, comprising the steps of:
   (a) generating a plurality of EPI MR image data sets from a volume of a subject to be imaged using a plurality of EPI sequences, wherein:
      (i) each EPI MR image data set is based on a simultaneous radiofrequency (RF) excitation of a plurality of slices within the volume, and
      (ii) each EPI sequence comprises an RF excitation pulse and an associated image data readout sequence;
   (b) generating a plurality of navigator sequences, wherein:
      (i) each navigator sequence comprises at least three echoes;
      (ii) at least one navigator sequence is a first type of navigator sequence that is phase encoded and comprises readout gradients that alternate in polarity for each echo; and
      (iii) at least one navigator sequence is a second type of navigator sequence that is phase encoded and comprises a readout gradient for each echo that is opposite in polarity to the corresponding readout gradient for the first type of navigator sequence;
   (c) correcting at least one EPI MR image data set for B0 drift effects and N/2 ghosting effects based at least in part on at least one of the first type of navigator sequence and at least one of the second type of navigator sequence; and
   (d) generating an image of the volume based at least in part on the at least one corrected EPI MR image data set,
   wherein at least one navigator sequence is a third type of navigator sequence that is not phase encoded, and wherein at least one EPI MR image data set is corrected for B0 drift effects based on at least one of the third type of navigator sequence.

2. The method of claim 1, wherein each navigator sequence is obtained following the RF excitation pulse and prior to the associated image data readout sequence of one of the plurality of EPI sequences.

3. The method of claim 1, wherein each EPI sequence comprises at least one navigator sequence.

4. The method of claim 1, wherein each EPI sequence comprises exactly one navigator sequence.

5. The method of claim 1, wherein the correcting of at least one EPI MR image data set comprises slice-specific correction for N/2 ghosting effects using a modified slice GRAPPA technique that is based on odd and even kernels.

6. The method of claim 5, wherein each slice GRAPPA kernel has a size greater than 3 in the phase encoding direction, and wherein the number of echoes in each navigator sequence is the same as the size of the slice GRAPPA kernel in the phase encoding direction.

7. The method of claim 3, wherein a first type of navigator sequence and a second type of navigator sequence are generated in an alternating pattern in successive EPI sequences of the plurality of EPI sequences.

8. The method of claim 2, wherein:
   each EPI sequence comprises exactly one navigator sequence; and
   a first type of navigator sequence, a second type of navigator sequence, and a third type of navigator sequence are generated in a sequential pattern in successive EPI sequences of the plurality of EPI sequences.

9. The method of claim 2, wherein:
   each EPI sequence comprises exactly one navigator sequence; and
   a third type of navigator sequence is generated in every other EPI sequence of the plurality of EPI sequences, and a first type of navigator sequence and a second type of navigator sequence are generated alternately in the intervening EPI sequences of the plurality of EPI sequences.

10. The method of claim 1, wherein the correcting of at least one EPI MR image data set is based at least in part on navigator data interpolated from a first navigator sequence and a second navigator sequence of the same type, wherein the first navigator sequence is generated before the at least one EPI MR image set and the second navigator is generated after the at least one EPI MR image set.

11. The method of claim 1, wherein the correcting of at least one EPI MR image data set is based at least in part on navigator data interpolated from a first navigator sequence and a second navigator sequence of the same type, wherein the first navigator sequence is generated before the at least one EPI MR image data set and the second navigator is generated after the at least one EPI MR image data set.

12. The method of claim 1, wherein:
each EPI sequence comprises exactly two navigator sequences; and
the two navigator sequences comprises a third type of navigator sequence and one of a first type of navigator sequence or a second type of navigator sequence.

13. The method of claim 1, wherein the correcting of at least one EPI MR image data set for B0 drift uses a dynamic off-resonance in k-space technique.

14. The method of claim 1, further comprising providing a balancing phase encoding blip after each phase-encoded navigator sequence to restore magnetization following each phase-encoded navigator sequence.

15. The method of claim 1, further comprising providing a corrective readout gradient following each of the second type of navigator sequence to provide a polarity of the subsequent image data readout sequence that is the same as the polarity of an image data readout sequence that follows each of the first type of navigator sequence.

16. The method of claim 1, wherein plurality of EPI sequences are diffusion-weighted spin-echo EPI sequences.

* * * * *